(12) United States Patent
Uemura

(10) Patent No.: US 6,528,828 B2
(45) Date of Patent: Mar. 4, 2003

(54) DIFFERENTIAL NEGATIVE RESISTANCE HBT AND PROCESS FOR FABRICATING THE SAME

(75) Inventor: Tetsuya Uemura, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/863,432

(22) Filed: May 24, 2001

(65) Prior Publication Data
US 2001/0048117 A1 Dec. 6, 2001

(30) Foreign Application Priority Data
May 25, 2000 (JP) ........................................ 2000-155264

(51) Int. Cl.$^7$ ............................................. H01L 29/737
(52) U.S. Cl. ...................... 257/197; 257/198; 257/586; 257/587; 257/592; 438/312; 438/316
(58) Field of Search ................................ 257/580, 581, 257/197, 198, 201, 582, 583, 586, 587, 592, 616, 595–602; 438/312, 315–319

(56) References Cited

U.S. PATENT DOCUMENTS 5,332,912 A * 7/1994 Nozu et al. ................. 257/197
5,767,540 A * 6/1998 Shimizu ..................... 257/197
6,313,488 B1 * 11/2001 Bakowski et al. .......... 257/198

OTHER PUBLICATIONS

K. Wang, et al., "Demonstration of High Peak–to–Valley Current Ratio in an N–p–n AlGaAs/GaAs Structure", J. Appl. Phys. 73 (11), Jun. 1, 1993, pp. 7990–7992.

* cited by examiner

Primary Examiner—Eddie Lee
Assistant Examiner—Bradley William Baumeister
(74) Attorney, Agent, or Firm—Whitham, Curtis & Christofferson, PC

(57) ABSTRACT

A differential negative resistance element includes a heavily doped GaAs layer interposed between a collector layer of lightly doped GaAs and an emitter layer of heavily doped AlGaAs, is shared between a base region between the collector layer and the emitter layer, a base contact region and a channel region between the base region and the base contact region, and a depletion layer is developed into the channel region together with the collector voltage so as to exhibit a differential negative resistance characteristics, wherein the channel region is formed through an epitaxial growth and etching so that the manufacturer easily imparts target differential negative resistance characteristics to the channel region.

18 Claims, 5 Drawing Sheets

DIFFERENTIAL NEGATIVE RESISTANCE HBT AND PROCESS FOR FABRICATING THE SAME

FIELD OF THE INVENTION

This invention relates to a semiconductor device and, more particularly, to a differential negative resistance element and a process for fabricating the differential negative resistance element.

DESCRIPTION OF THE RELATED ART

It has been proposed to modulate the base resistance of a bipolar transistor with the collector voltage. The bipolar transistor exhibits the collector current-to-collector voltage characteristics on the basis of the differential negative resistance. Such a differential negative resistance device and a process for fabricating the device are disclosed by Y. H. Wang et al. in "Demonstration of high Peak-to- Valley Current Ratio in an N-P-N AlGaAs/GaAs Structure", J. Appl. Phys., vol. 73, pages 7990.

The structure of the prior art differential negative resistance device is shown in FIG. 1. The prior art differential negative resistance device comprises a substrate 1, a collector layer 2 of one conductivity type, a base layer 3 of the opposite conductivity type and an emitter layer 4 of the one conductivity type. The substrate 1 is formed of heavily-doped n-type GaAs. The collector layer 2 is formed of lightly doped n-type GaAs, which is grown on the upper surface of the substrate 1. The base layer 3 is formed of heavily doped p-type GaAs, which is grown on a predetermined area of the upper surface of the collector layer 2. The emitter layer 4 is formed of n-type Al—GaAs, which is grown on the upper surface of the base layer 3.

The prior art differential negative resistance element further comprises a collector electrode 5, a base electrode 6, an emitter electrode 7 and a heavily doped p-type region 12. The collector electrode 5 is formed of AuGe/Au alloy, and is held in contact with the lower surface of the substrate 1. The heavily doped p-type region 12 is formed in a surface portion of the collector layer 2, and laterally extends to the predetermined area of the collector layer 2 under the base layer 3. The base electrode 6 is formed of AuZn/Au alloy, and is held in contact with the heavily doped p-type region 12. The emitter electrode 7 is formed of AuGe/Au alloy, and is held in contact with the upper surface of the emitter layer 4.

The emitter electrode is connected to the ground, and a positive constant voltage is applied to the base electrode 6. The collector electrode 5 is swept from zero volt to a certain positive voltage. The surface portion of the collector layer 2 is inverted to the p-type, and the inverted layer serves as a p-type channel for the holes. While the collector voltage is varied in a relatively small voltage range, the base electrode 6 is electrically connected to the base layer 3 through the p-type channel region, and the base current flows between the base electrode 6 and the base layer 3. The base current gives rise to the bipolar transistor action, and the collector current flows.

The collector voltage is increased. The p-type channel in the surface portion of the collector layer 2 is reduced, and the p-type channel is increased in resistance. Accordingly, the base current is reduced, and the collector current is reduced together with the base current. This results in the differential negative resistance.

The collector voltage is further increased. The p-type channel is perfectly eliminated from the surface portion of the collector layer 2, and the base electrode 6 is changed to the open-state. As a result, the collector current does not flow. The peak current and the valley current under the differential negative resistance are corresponding to the on-current and the off-current in a standard bipolar transistor, and the ratio between the peak current and the valley current, i.e., the on/off ratio is much larger than that of the standard bipolar transistor.

Description is hereinbelow made on the process for fabricating the prior art differential negative resistance element. First, the substrate 1 of heavily doped n-type GaAs is prepared. The substrate 1 is placed in a reaction chamber of a molecular beam epitaxial growing system, and the lightly doped n-type GaAs, the heavily doped p-type GaAs and the n-type $Al_{0.3}Ga_{0.7}As$ are successively grown on the heavily doped n-type GaAs substrate 1. The lightly doped n-type GaAs is doped with silicon of the order of $5 \times 10^{16}$ cm$^{-3}$, and is grown to 500 nanometers thick for the collector layer 2. The heavily doped p-type GaAs is doped with beryllium of the order of $5 \times 10^{18}$ cm$^{-3}$, and is grown to 200 nanometers thick for the base layer 3. The n-type $Al_{0.3}Ga_{0.7}As$ is doped with silicon of the order of $5 \times 10^{17}$ cm$^{-3}$, and serves as the emitter layer 4.

Subsequently, the n-type $Al_{0.3}Ga_{0.7}As$ layer and the heavily doped p-type GaAs layer are partially etched away so as to leave the base layer 3 and the emitter layer 4 on and over the predetermined area of the upper surface of the collector layer 2. When the etching is completed, the other area of the upper surface of the collector layer 2 is exposed. Au-Zn alloy is evaporated onto the exposed surface of the collector layer 2, and the base electrode 6 is formed on the exposed surface of the collector layer 2. Thereafter, the resultant structure is treated with heat at 450 degrees in centigrade. While the resultant structure is being treated with heat, Zn is diffused from the base electrode 6 into the surface portion of the collector layer 2, and forms the heavily doped p-type region 12 in the collector layer 2. The diffused Zn serves as the acceptor, and makes the surface portion of the collector layer 2 serve as the p-type channel. Finally, AuGe/Au is evaporated onto the lower surface of the substrate 1 and the upper surface of the emitter layer 4, and forms the collector electrode 5 and the emitter electrode 7 on the lower surface of the substrate 1 and the upper surface of the emitter layer 4, respectively.

As described hereinbefore, the p-type channel between the base electrode 6 and the base layer 3 is controlled with the collector voltage, and needs satisfying the following two requirements, which are contrary to each other. The first requirement is that the p-type channel extends from the region under the base electrode 6 to the region under the base layer 3. The second requirement is that the p-type channel is thin enough to control. However, it is difficult to satisfy both of the first and second requirements concurrently.

The p-type channel is formed by Zn, which was diffused from the base electrode 6, and the base electrode 6 is laterally spaced from the base layer 3. If the heat treatment is continued for a long time, Zn can reach the region under the base layer 3. However, Zn is also diffused in the direction of depth during the heat treatment, and makes the p-type channel thick. The thick p-type channel is hardly controlled with the collector voltage. On the other hand, if the heat treatment is shortened, the p-type channel is made to be thin. However, Zn does not reach the region under the base layer 3. In the circumstances, it is necessary for the manufacturer to locate the base electrode 6 at the optimum position on the collector layer 2, and the diffusion is strictly controlled for satisfying the two requirements. For this reason, the p-type channel is not reproducible. This is the first problem inherent in the prior art differential negative resistance element.

Another problem is a relatively small ratio between the peak current and the valley current. This is because of the fact that the boundary between the collector layer 2 and the p-type channel is gentle, i.e., not sharp. The collector voltage can not sharply modulate the channel resistance, and the ratio is relatively small.

SUMMARY OF THE INVENTION

It is therefore an important object of the present invention to provide a differential negative resistance element, which achieves a large ratio between the peak current and the valley current.

It is also an important object of the present invention to provide a process, through which a base electrode is electrically connectable to a base layer through a thin channel to be promptly controlled with a collector voltage.

To accomplish the object, the present invention proposes to use a base layer as a channel layer. The base layer is made to be thin enough to vary the base resistance with a collector voltage. The thickness of the base layer is easily controllable, and the channel in the thin base region is well reproducible. The channel resistance is dominated by the thickness of the base region and the dopant concentration therein. The present inventor found the optimum range of the product between the thickness and the dopant concentration to be from $1\times10^{11}$ cm$^{-2}$ to $1\times10^{13}$ cm$^{-2}$. When the product is fallen within this range, the channel sharply varies the resistance depending upon the collector voltage.

In accordance with one aspect of the present invention, there is provided a differential negative resistance element comprising a multi-layered semiconductor structure formed on a substrate and including a first semiconductor layer having a first conductivity type and serving as one of a collector region and an emitter region of a bipolar transistor, a second semiconductor layer having a second conductivity type opposite to the first conductivity type and serving as a base contact region, a base region and a channel region located between the base contact region and the base region and a third semiconductor layer having the first conductivity type and serving as the other of the collector region and the emitter region, and collector, base and emitter electrodes serving as ohmic electrodes respectively connected to the collector, the base contact region and the emitter region, wherein the channel region is reduced in thickness so as to vary an electric resistance with a collector voltage applied to the collector electrode. In accordance with another aspect of the present invention, there is provided a process for fabricating a differential negative resistance element comprising the steps of a) successively growing a first semiconductor layer having a first conductivity type and serving as one of a collector region and an emitter region of a bipolar transistor, a second semiconductor layer having a second conductivity type opposite to the first conductivity type and serving as a base contact region, a base region and a channel region located between the base contact region and the base region and a third semiconductor layer having the first conductivity type and serving as the other of the collector region and the emitter region on a substrate, b) partially etching the third semiconductor layer so as to expose a portion of the second semiconductor layer, c) partially etching the portion of the second semiconductor layer so as to form the channel region between the base contact region and the base region so that a collector voltage applied to the collector electrode varies an electric resistance in the channel region and d) forming a collector electrode, a base electrode and an emitter electrode held in contact with the collector region, the base contact region and the emitter region in an ohmic manner.

BRIEF DESCRIPTION OF THE DRAWINGS

The features and advantages of the differential negative resistance element and the process will be more clearly understood from the following description taken in conjunction with the accompanying drawings in which.

DESCRIPTION OF THE PREFERRED EMBODIMENTS

First Embodiment

Figure 1:
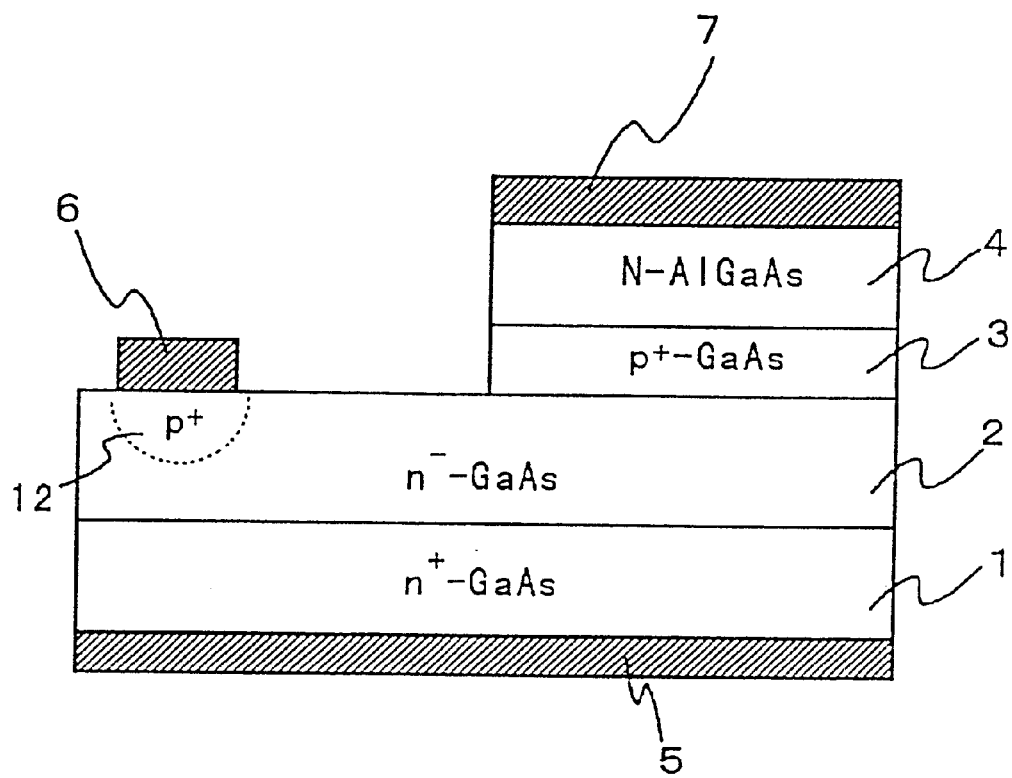
FIG. 1 is a cross sectional view showing the structure of the prior art differential negative resistance element.
Figure 2:
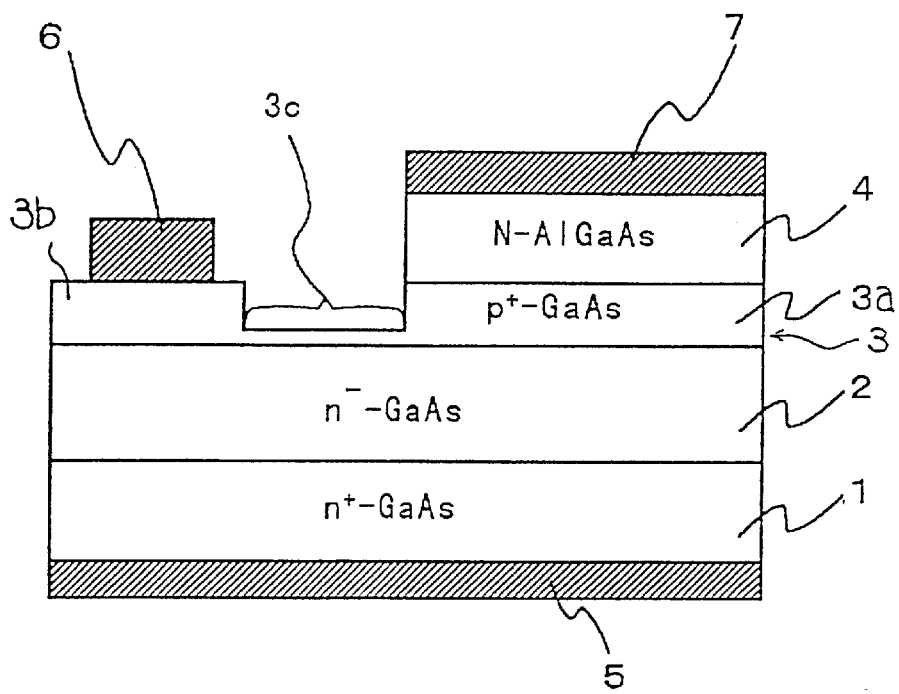
FIG. 2 is a cross sectional view showing the structure of a differential negative resistance element according to the present invention.

Referring to FIG. 2 of the drawings, a differential negative resistance element embodying the present invention comprises a compound semiconductor substrate 1, a collector layer 2, a base region 3a, a base contact region 3b, a channel region 3c and an emitter layer 4. The compound semiconductor substrate 1 is formed of heavily doped n-type GaAs, the collector layer 2 is formed of lightly doped n-type GaAs, and the emitter layer 4 is formed of n-type Al$_{0.3}$Ga$_{0.7}$As. The base region 3a shares a heavily doped p-type GaAs layer 3 with the base contact region 3b and the channel region 3c, and the channel region 3c is thinner than the base region 3a. The thickness of the channel region 3c is reduced in such a manner as to vary the electric resistance with the potential level applied to the collector electrode 5, i.e., the collector voltage. The collector layer 2, the heavily doped p-type GaAs layer 3 and the emitter layer 4 are laminated on and over the compound semiconductor substrate 1 as shown.

The differential negative resistance element according to the present invention further comprises a collector electrode 5, a base electrode 6 and an emitter electrode 7. The collector electrode 5 and the emitter electrode 7 are formed of AgGe/Au alloy, and the base electrode 6 is formed of AuZn/Au alloy. Although the collector electrode 5 and the emitter electrode 7 are respectively formed on the lower surface of the compound semiconductor substrate 1 and the upper surface of the emitter layer 4 as similar to those of the prior art differential negative resistance element, the base electrode 6 is formed on the base contact region 3b, not on the collector layer 2, and the base contact region 3b is located on the opposite side to the base region 3a with respect to the channel region 3c. The collector electrode 5 and the compound semiconductor substrate 1, the base electrode 6 and the base contact region 3b, the emitter electrode 7 and the emitter layer 4 form ohmic contacts accordingly. Thus, the differential negative resistance element embodying the present invention has the features of a bipolar transistor.

The differential negative resistance element behaves as follows. The emitter electrode 7 is connected to the ground, and the base electrode 6 is biased with a positive voltage. The collector electrode 5 is swept from zero voltage to a certain positive voltage. Since the base contact region 3b is electrically connected through the channel region 3c to the base region 3a, electric current flows through the channel region 3c to the base region 3a under the application of a relatively small collector voltage. The base current gives rise to the bipolar transistor action, and collector current flows from the collector electrode 5 through the collector layer 2.

The collector voltage is increased. The channel region 3c is partially depleted, and the channel resistance is increased. Accordingly, the base current is reduced, and the collector current is also reduced. Thus, the differential negative resistance element exhibits the differential negative resistance.

The collector voltage is further increased. The channel region 3c is perfectly depleted, and the base region 3a is electrically isolated from the base electrode 6. In other words, the base electrode 6 is changed to the open-state, and the collector current does not flow.

The present inventor investigated the differential negative resistance element from the aspect of the ratio between the peak current and the valley current, and confirmed that the ratio was five times larger than that of the prior art differential negative resistance element.

Figure 3A:
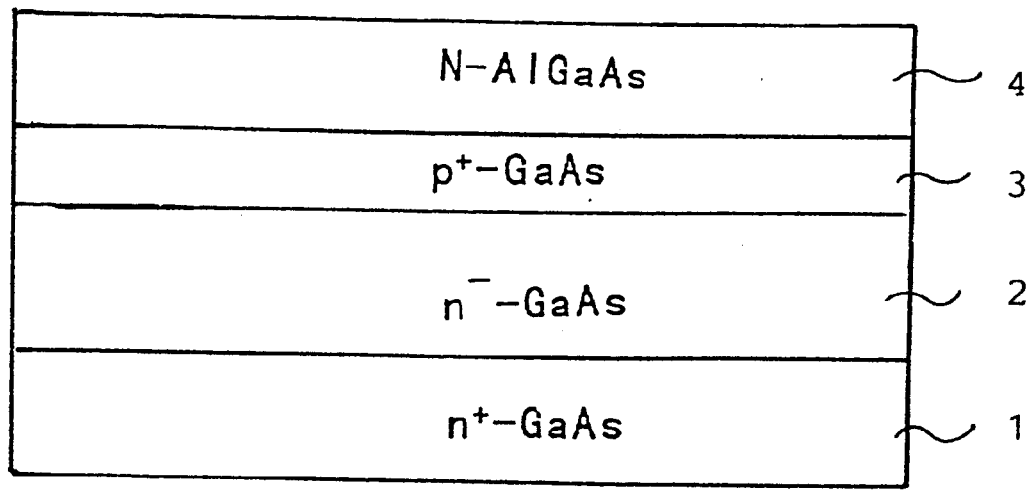
FIGS. 3A to 3C are cross sectional views showing a process for fabricating a differential negative resistance element according to the present invention.
Figure 3B:
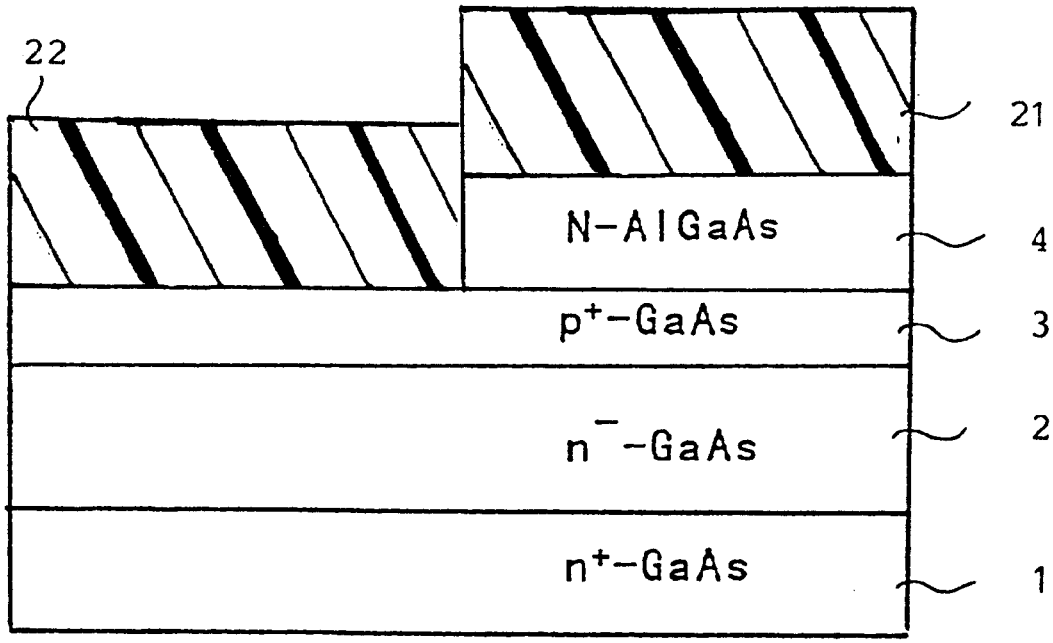

The differential negative resistance element is fabricated as follows. Firstly, the compound semiconductor substrate 1 of heavily doped n-type GaAs is prepared. Lightly doped n-type GaAs, heavily doped p-type GaAs and n-type $Al_{0.3}Ga_{0.7}As$ are successively grown on the heavily doped n-type GaAs substrate 1 by using a molecular beam epitaxial growing technique. The lightly doped n-type GaAs is doped with silicon of the order of $5 \times 10^{16}$ cm$^{-3}$, and is grown to 500 nanometers thick for the collector layer 2. The heavily doped p-type GaAs is doped with beryllium of the order of $5 \times 10^{18}$ cm$^{-3}$, and is grown to 200 nanometers thick for the base/ base contact/channel regions 3a/3b/3c. The n-type $Al_{0.3}Ga_{0.7}As$ is doped with silicon of the order of $5 \times 10^{17}$ cm$^{-3}$, and serves as the emitter layer 4. As a result, a laminated structure of compound semiconductor is obtained as shown in FIG. 3A. Subsequently, photo-resist solution is spun onto the n-type AlGaAs layer 4, and is baked so as to form a photo-resist layer. A pattern image for the emitter layer 4 is transferred from a photo mask (not shown) to the photo-resist layer, and a latent image is formed in the photo-resist layer. The latent image is developed, and a photo-resist etching mask 21 is left on the n-type AlGaAs layer 4. Namely, the photo-resist etching mask 21 is formed on the n-type AlGaAs layer 4 by using photo-lithographic techniques. Using the photo-resist etching mask 21, the n-type AlGaAs layer 4 is partially etched away, and the emitter layer 4 is formed on the heavily doped p-type GaAs layer 3 as shown in FIG. 3B. The photo-resist etching mask 21 is stripped off.

Figure 3C:
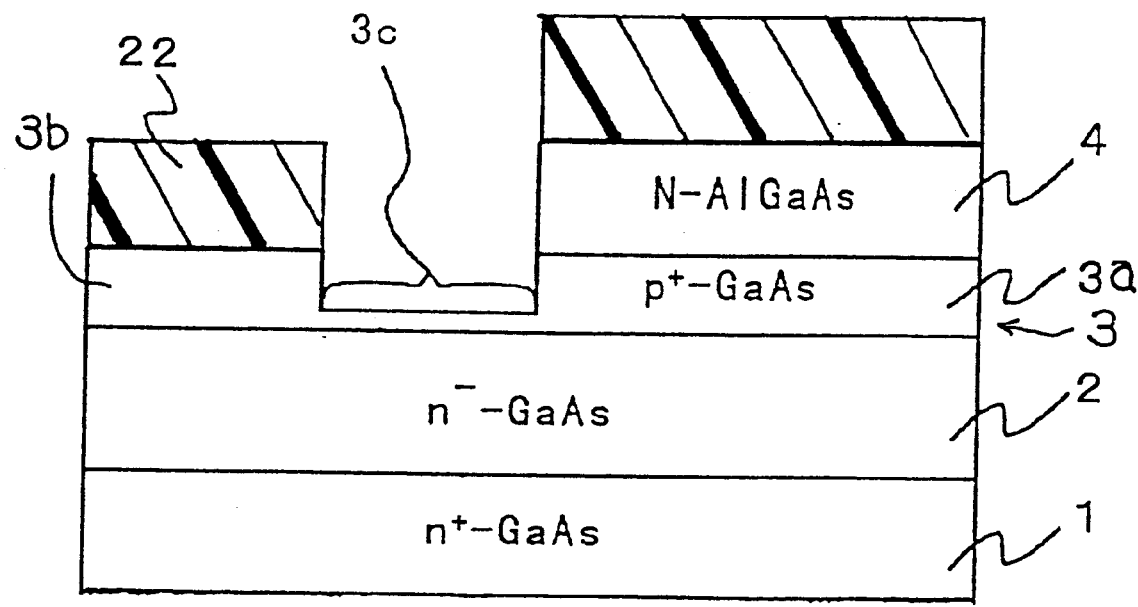

Another photo-resist etching mask 22 is formed on the resultant structure by using the photo-lithographic techniques. The emitter layer 4 and the base contact region 3b are covered with the photo-resist etching mask 22, and a part of the heavily doped p-type GaAs layer 3 assigned to the channel region 3c is exposed to the space formed in the photo-resist etching mask 22. Using the photo-resist etching mask 22, the heavily-doped p-type GaAs layer 3 is partially etched away, and the channel region 3c is left on the heavily doped n-type GaAs collector layer 2 as shown in FIG. 3C. In this instance, the etching is finished at the thickness of 20 nanometers. In other words, the channel region 3c of 20 nanometers thick is left on the collector layer 2 between the base region 3a and the base contact region 3b. The photo-resist etching mask 22 is stripped off. The etching control is much more precise rather than the diffusion control. For this reason, the manufacturer can adjust the channel region 3c to the optimum thickness. The product of the dopant concentration and the thickness of the channel region 3c is fallen within the range between $1 \times 10^{11}$ cm$^{-2}$ and $1 \times 10^{13}$ cm$^{-2}$.

Finally, the two kinds of alloy are respectively evaporated onto the base contact region 3b and the emitter/compound semiconductor substrate 4/1 for forming the base electrode 6, the emitter electrode 7 and the collector electrode 5.

In the first embodiment, the lightly doped GaAs layer 2, the heavily doped p-type GaAs layer 3 and the n-type AlGaAs layer 4 are corresponding to the first semiconductor layer, the second semiconductor layer and the third semiconductor layer, respectively.

As will be understood from the foregoing description, the thickness and the dopant concentration of the channel region 3c are precisely controlled through the molecular beam epitaxy and the etching. As a result, the manufacturer can form the channel region 3c as he designed. In other words, the differential negative resistance element is free from the trade-off inherent in the prior art differential negative resistance element. Moreover, the junction between the channel region 3c and the collector layer 2 is so sharp that the differential negative resistance element achieves the ratio between the peak current and the valley current five times larger than the ratio of the prior art differential negative resistance element. Thus, the differential negative resistance element according to the present invention exhibits good modulating characteristics of channel resistance with the collector voltage.

Second Embodiment

Figure 4:
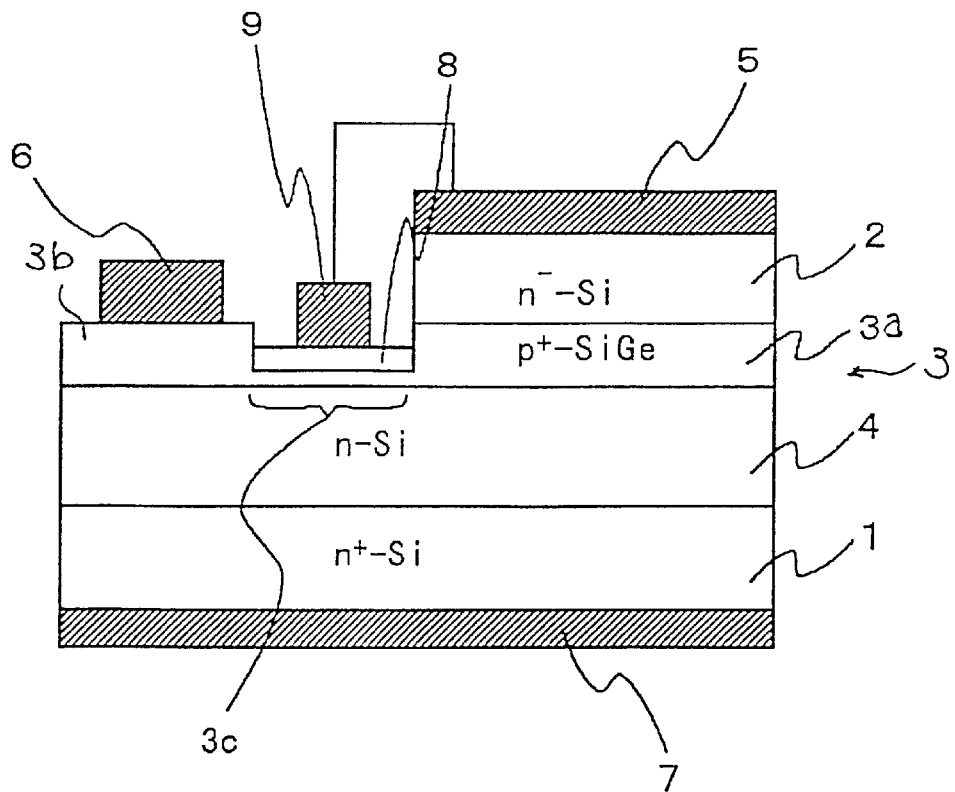
FIG. 4 is a cross sectional view showing the structure of another differential negative resistance element according to the present invention.

FIG. 4 shows another differential negative resistance element embodying the present invention. The differential negative resistance element implementing the second embodiment also comprises a compound semiconductor substrate 1, a collector layer 2, a base region 3a, a base contact region 3b, a channel region 3c, an emitter layer 4, a collector electrode 5, a base electrode 6 and an emitter electrode 7. The differential negative resistance element implementing the second embodiment is different from that of the first embodiment in that the emitter layer 4 and the collector layer 2 are replaced with one another and that a gate electrode 9 is formed on a gate insulating layer 8 covering the channel region 3c. The collector electrode 5 is connected to the gate electrode 9, and the collector voltage is applied to the gate electrode 9.

The compound semiconductor substrate 1, the collector layer 2, the base region/base contact region/channel region 3a/3b/3c and the emitter layer 4 are formed of heavily doped n-type silicon, lightly doped n-type silicon, heavily doped p-type $Si_{0.85}Ge_{0.15}$ and n-type silicon, respectively. The collector electrode 5, the base electrode 6, the emitter electrode 7 and the gate electrode 9 are formed of aluminum, and the gate insulating layer 8 is formed of thermal oxide of SiGe.

The differential negative resistance element shown in FIG. 4 behaves as follows. The emitter electrode 7 is connected to the ground, and the base electrode 6 is biased with a positive voltage. The collector electrode 5 and the gate electrode 9 are swept from zero voltage to a certain positive voltage. Since the base contact region 3b is electrically connected through the channel region 3c to the base region 3a, electric current flows through the channel region 3c to the base region 3a in so far as the collector voltage is relatively small. The base current gives rise to the bipolar transistor action, and collector current flows from the collector electrode 5 through the collector layer 2.

The collector voltage and, accordingly, the gate voltage are increased. The channel region 3c is partially depleted, and the channel resistance is increased. Accordingly, the base current is reduced, and the collector current is also reduced. Thus, the differential negative resistance element exhibits the differential negative resistance.

The collector voltage is further increased. The channel region 3c is perfectly depleted, and the base region 3a is electrically isolated from the base electrode 6. In other words, the base electrode 6 is changed to the open-state, and the collector current does not flow.

The differential negative resistance element is fabricated as follows. Firstly, the compound semiconductor substrate 1 of heavily doped n-type Si is prepared. N-type Si, heavily doped p-type $Si_{0.85}Ge_{0.15}$ and n-type Si are successively grown on the heavily doped n-type Si substrate 1 by using a molecular beam epitaxial growing technique. The n-type Si is doped with arsenic of the order of $5 \times 10^{17}$ cm$^{-3}$, and is grown to 500 nanometers thick for the emitter layer 4. The heavily doped p-type $Si_{0.85}Ge_{0.15}$ is doped with boron of the order of $5 \times 10^{18}$ cm$^{-3}$, and is grown to 100 nanometers thick for the base/base contact/channel regions 3a/3b/3c. The n-type Si is doped with arsenic of the order of $5 \times 10^{16}$ cm$^{-3}$, and serves as the collector layer 2. As a result, a laminated structure of compound semiconductor is obtained.

Subsequently, photo-resist solution is spun onto the n-type Si layer 2, and is baked so as to form a photo-resist layer (not shown). A pattern image for the collector layer 2 is transferred from a photo mask (not show) to the photo-resist layer, and a latent image is formed in the photo-resist layer. The latent image is developed, and a photo-resist etching mask (not shown) is left on the n-type Si layer 2. Namely, the photo-resist etching mask is formed on the n-type Si layer by using photo-lithographic techniques. Using the photo-resist etching mask, the n-type Si layer 2 is partially etched away, and the collector layer 2 is formed on the heavily doped p-type $Si_{0.85}Ge_{0.15}$ layer 3. The photo-resist etching mask is stripped off.

Another photo-resist etching mask (not shown) is formed on the resultant structure by using the photo-lithographic techniques. The collector layer 2 and the base contact region 3b are covered with the photo-resist etching mask, and a part of the heavily doped p-type $Si_{0.85}Ge_{0.15}$ layer 3 assigned to the channel region 3c is exposed to the space formed in the photo-resist etching mask. Using the photo-resist etching mask, the heavily-doped p-type $Si_{0.85}Ge_{0.15}$ layer 3 is partially etched away, and the channel region 3c is left on the heavily doped n-type Si emitter layer 4. In this instance, the etching is finished at the thickness of 25 nanometers. In other words, the channel region 3c of 25 nanometers thick is left on the emitter layer 4 between the base region 3a and the base contact region 3b. The photo-resist etching mask is stripped off. The etching control is much more precise rather than the diffusion control. For this reason, the manufacturer can adjust the channel region 3c to the optimum thickness. After the etching, a surface portion of the channel region 3c is thermally oxidized, and the channel region 3c is covered with the gate insulating layer 8. The surface portion to be oxidized is 5 nanometers thick. The channel region of 20 nanometers thick is left on the collector layer 2. The product of the dopant concentration and the thickness of the channel region 3c is fallen within the range between $1 \times 10^{11}$ cm$^{-2}$ and $1 \times 10^{13}$ cm$^{-2}$.

Finally, the aluminum is deposited onto the collector layer 2, the base contact region 3b, the gate insulating layer 8 and the compound semiconductor substrate for forming the collector electrode 5, the base electrode 6, the gate electrode 9 and the emitter electrode 7.

In the second embodiment, the n-type Si layer 4, the heavily doped p-type SiGe layer 3 and the lightly doped n-type Si layer 2 are corresponding to the first semiconductor layer, the second semiconductor layer and the third semiconductor layer, respectively.

The channel region 3c is precisely formed through the process according to the present invention, and the differential negative resistance element achieves the advantages of the first embodiment.

The channel region 3c is covered with the gate insulating layer 8, and the leakage current is reduced by one order of magnitude or more.

Third Embodiment

Figure 5:
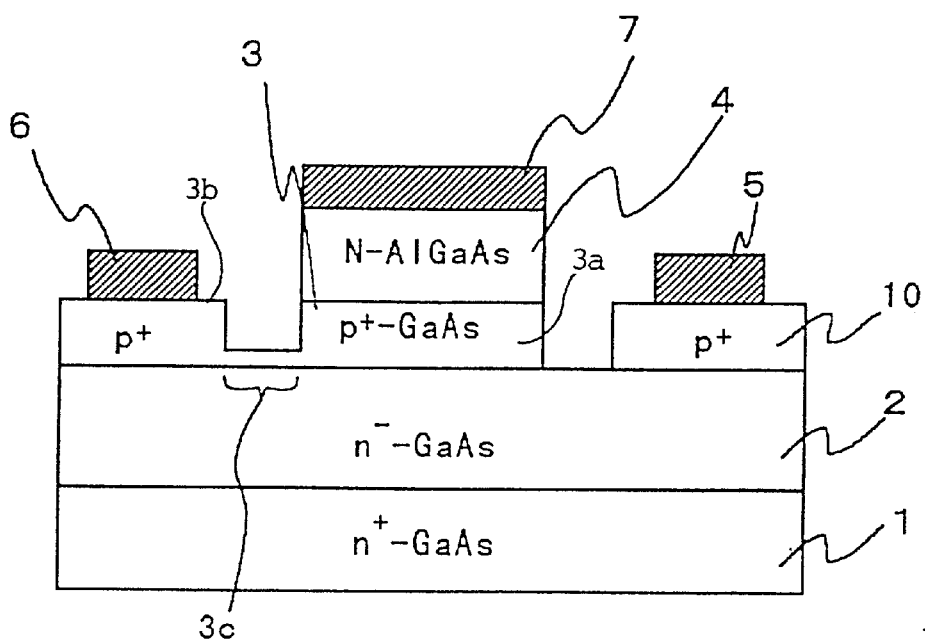
FIG. 5 is a cross sectional view showing the structure of yet another differential negative resistance element according to the present invention.

Turning to FIG. 5 of the drawings, yet another differential negative resistance element embodying the present invention comprises a compound semiconductor substrate 1, a collector layer 2, a base region 3a, a base contact region 3b, a channel region 3c, an emitter layer 4 and a collector contact region 10. The compound semiconductor substrate 1 is formed of heavily doped n-type GaAs, the collector layer 2 is formed of lightly doped n-type GaAs, and the emitter layer 4 is formed of n-type $Al_{0.3}Ga_{0.7}As$. The base region 3a shares a heavily doped p-type GaAs layer 3 with the base contact region 3b and the channel region 3c, and the collector contact region 10 is formed of the heavily doped p-type GaAs. The channel region 3c is thinner than the base region 3a. The thickness of the channel region 3c is reduced in such a manner as to vary the electric resistance with the potential level applied to the collector electrode 5, i.e., the collector voltage. As will be described hereinlater, although the collector contact region 10 is spaced from the base region 3a, a heavily doped p-type GaAs layer 3 is shared between the collector contact region 10 and the base/base contact/channel regions 3a/3b/3c. The collector layer 2, the heavily doped p-type GaAs layer 3 and the emitter layer 4 are laminated on and over the compound semiconductor substrate 1 as shown.

The differential negative resistance element according to the present invention further comprises a collector electrode 5, a base electrode 6 and an emitter electrode 7. The collector electrode 5 is formed of AuGe/Au alloy, and the base electrode 6 and the collector electrode 5 are formed of AuZn/Au alloy. Although the base electrode 6 and the emitter electrode 7 are respectively formed on the upper surface of the base contact region 3b and the upper surface of the emitter layer 4 as similar to the differential negative resistance element implementing the first embodiment, the collector electrode 5 is formed on the collector contact region 10, and the collector contact region 10 is located on the opposite side to the base contact region 3b with respect to the base region 3a. The collector electrode 5 and the collector contact region 10, the base electrode 6 and the base contact region 3b and the emitter electrode 7 and the emitter layer 4 form ohmic contacts, respectively. Thus, the differential negative resistance element embodying the present invention has the features of a bipolar transistor.

The differential negative resistance element behaves as follows. The emitter electrode 7 is connected to the ground, and the base electrode 6 is biased with a positive voltage. The collector electrode 5 is swept from zero voltage to a certain positive voltage. The base contact region 3b is electrically connected through the channel region 3c to the base region 3a, and the base electrode 6 can supply electric current to the base region 3a at all times. When the collector voltage is smaller than the base voltage, the p-n junction between the collector contact region 10 and the collector layer 2 is reversely biased in so far as the collector voltage is smaller than the base voltage, and any collector current does not flow. When the collector voltage exceeds the base voltage, the p-n junction is forwardly biased, and the collector electric current starts to flow in so far as the collector voltage is relatively small. Then, the differential negative resistance element starts the bipolar action.

The collector voltage is increased. The channel region 3c is partially depleted, and the channel resistance is increased. Accordingly, the base current is reduced, and the collector current is also reduced. Thus, the differential negative resistance element exhibits the differential negative resistance.

The collector voltage is further increased. The channel region 3c is perfectly depleted, and the base region 3a is electrically isolated from the base electrode 6. In other words, the base electrode 6 is changed to the open-state, and the collector current does not flow.

In the differential negative resistance elements implementing the first and second embodiments, when the collector voltage is smaller than the base voltage, the p-n junction between the collector layer 2 and the base layer 3a is forwardly biased, and the electric current flows from the collector layer 2 through the p-n junction into the base region 3a. Since the collector contact region 10 is inserted between the collector electrode 5 and the collector layer 2, the p-n junction between the collector contact region 10 and the collector layer 2 does not allow the electric current to flow into the collector layer 2 until the collector voltage exceeds the base voltage. This means that the heavily doped p-type collector contact region 10 is effective against the forward current.

The differential negative resistance element is fabricated as follows. Firstly, the compound semiconductor substrate 1 of heavily doped n-type GaAs is prepared. Lightly doped n-type GaAs, heavily doped p-type GaAs and n-type $Al_{0.3}Ga_{0.7}As$ are successively grown on the heavily doped n-type GaAs substrate 1 by using a molecular beam epitaxial growing technique. The lightly doped n-type GaAs is doped with silicon of the order of $5\times10^{16}$ cm$^{-3}$, and is grown to 500 nanometers thick for the collector layer 2. The heavily doped p-type GaAs is doped with beryllium of the order of $5\times10^{18}$ cm$^{-3}$, and is grown to 200 nanometers thick for the base/base contact/channel/collector contact regions 3a/3b/3c/10. The n-type $Al_{0.3}Ga_{0.7}As$ is doped with silicon of the order of $5\times10^{17}$ cm$^{-3}$, and serves as the emitter layer 4. As a result, a laminated structure of compound semiconductor is obtained.

Subsequently, a photo-resist etching mask (not shown) is formed on the n-type AlGaAs layer 4 by using the photolithographic techniques. Using the photo-resist etching mask, the n-type AlGaAs layer 4 is partially etched away, and the emitter layer 4 is formed on the heavily doped p-type GaAs layer 3. The photo-resist etching mask is stripped off.

Another photo-resist etching mask (not shown) is formed on the resultant structure by using the photo-lithographic techniques. The emitter layer 4, the base contact region 3b and the collector contact region 10 are covered with the photo-resist etching mask, and a part of the heavily doped p-type GaAs layer 3 assigned to the channel region 3c and another part of the heavily doped p-type GaAs layer 3 between the base region 3a and the collector contact region 10 are exposed to the spaces formed in the photo-resist etching mask. Using the photo-resist etching mask, the heavily-doped p-type GaAs layer 3 is partially etched away until the exposed parts are reduced to 20 nanometers thick. The photo-resist etching mask is stripped off, and yet another photoresist etching mask is formed on the resultant structure by using the photolithographic techniques. The part of the heavily doped p-type GaAs layer 3 between the base region 3a and the collector contact region 10 is exposed to a space formed in the photo-resist etching mask. The exposed portion is etched away. Then, only the channel region 3c of 20 nanometers thick is left on the collector layer 2 between the base region 3a and the base contact region 3b. The product of the dopant concentration and the thickness of the channel region 3c is fallen within the range between $1\times10^{11}$ cm$^{-2}$ and $1\times10^{13}$ cm$^{-2}$. The photo-resist etching mask is stripped off. The etching control is much more precise rather than the diffusion control. For this reason, the manufacturer can adjust the channel region 3c to the optimum thickness.

Finally, the two kinds of alloy are respectively evaporated onto the base contact region 3b, the collector contact region 10 and the emitter layer 4 for forming the base electrode 6, collector electrode 5 and the emitter electrode 7. In the third embodiment, the lightly doped n-type GaAs layer 2, the heavily doped p-type GaAs layer 3a/3b/3c, the n-type AlGaAs and the heavily doped p-type GaAs layer 10 are corresponding to the first semiconductor layer, the second semiconductor layer, the third semiconductor layer and the fourth semiconductor layer, respectively.

The differential negative resistance element and the fabrication process thereof achieve all the advantages of the first embodiment. Moreover, the collector contact region 10 prevents the collector layer 2 from the forward current until the collector voltage exceeds the base voltage.

Fourth Embodiment

Figure 6:
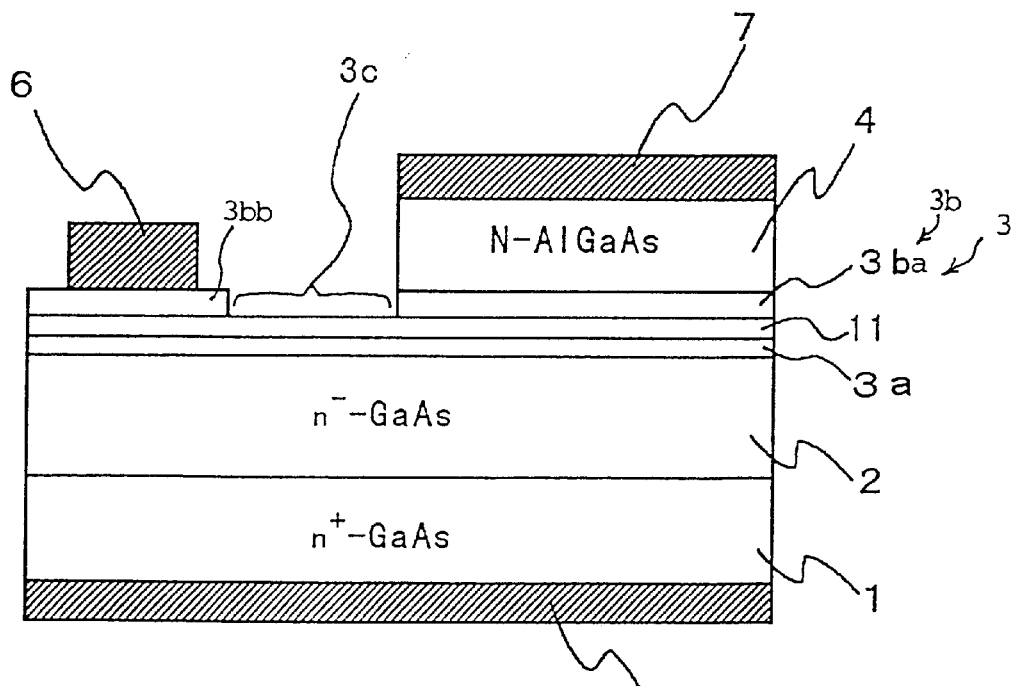
FIG. 6 is a cross sectional view showing the structure of still another differential negative resistance element according to the present invention.

Turning to FIG. 6 of the drawings, still another differential negative resistance element embodying the present invention comprises a compound semiconductor substrate 1, a collector layer 2, a base region 3a/11/3ba, a base contact region 3bb/11, a channel region 3c and an emitter layer 4. The compound semiconductor layer 11 is identical in conductivity type with the compound semiconductor layer for the other parts of the base/base contact channel regions 3a/3b/3bb/3c, and serves as an etching stopper in a fabrication process as will be hereinlater described in detail.

The compound semiconductor substrate 1 is formed of heavily doped n-type GaAs, the collector layer 2 is formed of lightly doped n-type GaAs, and the emitter layer 4 is formed of n-type $Al_{0.3}Ga_{0.7}As$. The compound semiconductor layer forming parts of the base/base contact/channel region 3a/3ba/3bb/3c is heavily doped p-type GaAs layer 3, and the compound semiconductor layer 11 is heavily doped p-type AlAs. The channel region 3c is thinner than the base region 3a/11/3ba. The thickness of the channel region 3c is reduced in such a manner that the collector voltage varies the electric resistance therein. The collector layer 2, the heavily doped p-type GaAs layer 3, the heavily doped p-type AlAs layer 11 and the emitter layer 4 are laminated on and over the compound semiconductor substrate 1 as shown.

The differential negative resistance element according to the present invention further comprises a collector electrode 5, a base electrode 6 and an emitter electrode 7. The collector electrode 5 and the emitter electrode 7 are formed of AuGe/Au alloy, and the base electrode 6 is formed of AuZn/Au alloy. The base electrode 6 and the emitter electrode 7 are respectively formed on the upper surface of the base contact region 3*bb*/11 and the upper surface of the emitter layer 4, and the collector electrode 5 is formed on the lower surface of the compound semiconductor substrate 1. The collector electrode 5 and the compound semiconductor substrate 1, the base electrode 6 and the base contact region 3*bb* and the emitter electrode 7 and the emitter layer 4 form ohmic contacts, respectively. Thus, the differential negative resistance element embodying the present invention has the features of a bipolar transistor.

Since the compound semiconductor layer 11 is identical in conductivity type with the compound semiconductor layer 3, the base region 3*a*/11/3*ba*, the base contact region 3*bb*/11 and the channel region 3*c*, i.e. 11/3*a* behave as similar to those of the first embodiment, and the behavior of the differential negative resistance element is analogous to that of the first embodiment. For this reason, description on the behavior is omitted for avoiding repetition.

The particular feature of the differential negative resistance element implementing the fourth embodiment is directed to a fabrication process. As described hereinbefore, the compound semiconductor layer 11 serves as an etching stopper in the fabrication process, because the etching speed is different between the heavily doped p-type GaAs and the heavily doped p-type AlAs. Using the etching stopper, the manufacturer precisely controls the etching process, and adjusts the channel region 3*c* to a target thickness.

The differential negative resistance element is fabricated as follows. Firstly, the compound semiconductor substrate 1 of heavily doped n-type GaAs is prepared. Lightly doped n-type GaAs, heavily doped p-type GaAs, heavily doped p-type AlAs, heavily doped p-type GaAs and n-type $Al_{0.3}Ga_{0.7}As$ are successively grown on the heavily doped n-type GaAs substrate 1 by using a molecular beam epitaxial growing technique. The lightly doped n-type GaAs is doped with silicon of the order of $5 \times 10^{16}$ cm$^{-3}$, and is grown to 500 nanometers thick for the collector layer 2. The heavily doped p-type GaAs is doped with beryllium of the order of $5 \times 10^{18}$ cm$^{-3}$, and is grown to 20 nanometers thick for the lower base/base contact/channel regions 3*a*. The heavily doped p-type AlAs is doped with beryllium of the order of $5 \times 10^{18}$ cm$^{-3}$, and is grown to 2 nanometers thick for the lower base/base contact/channel regions 11. The heavily doped p-type AlAs layer serves as the etching stopper in a later stage. The heavily doped p-type GaAs is doped with beryllium of the order of $5 \times 10^{18}$ cm$^{-3}$, and is grown to 20 nanometers thick for the upper base/base contact regions 3*b*, i.e., 3*ba*/3*bb*. The n-type $Al_{0.3}Ga_{0.7}As$ is doped with silicon of the order of $5 \times 10^{17}$ cm$^{-3}$, and serves as the emitter layer 4. As a result, a laminated structure of compound semiconductor is obtained.

Subsequently, a photo-resist etching mask (not shown) is formed on the n-type AlGaAs layer 4 by using the photo-lithographic techniques. Using the photo-resist etching mask, the n-type AlGaAs layer 4 is partially etched away, and the emitter layer 4 is formed on the heavily doped p-type GaAs layer 3*b*. The photo-resist etching mask is stripped off.

Another photo-resist etching mask (not shown) is formed on the resultant structure by using the photo-lithographic techniques. The emitter layer 4 and the base contact region 3*bb* are covered with the photo-resist etching mask, and a part of the heavily doped p-type GaAs layer 3*b* assigned to the channel region 3*c* is exposed to the space formed in the photo-resist etching mask. Using the photo-resist etching mask, the heavily-doped p-type GaAs layer 3*b* is partially etched away until the heavily doped p-type AlAs layer 11 is exposed. Wet etching solution is used in the etching step, and contains citric acid and hydrogen peroxide so as to exhibit large selectivity between the GaAs and AlAs. The photo-resist etching mask is stripped off. The etching control is much more precise rather than the diffusion control. For this reason, the manufacturer can adjust the channel region 3*c* to the optimum thickness.

Finally, the two kinds of alloy are respectively evaporated onto the base contact region 3*bb*/11, the compound semiconductor substrate 1 and the emitter layer 4 for forming the base electrode 6, collector electrode 5 and the emitter electrode 7.

In the fourth embodiment, the lightly doped n-type GaAs layer 2, the heavily doped p-type GaAs layers 3*a*/3*b*, the n-type AlGaAs layer and the heavily doped p-type AlAs layer 11 are corresponding to the first semiconductor layer, the second semiconductor layer, the third semiconductor layer and the fourth semiconductor layer, respectively.

The differential negative resistance element achieves all the advantages of the first embodiment. The present inventor confirmed that the ratio between the peak current and the valley current is five times larger than that of the prior art. Moreover, the channel region 3*c* is precisely adjusted to a target thickness by virtue of the etching stopper 1.

Any material is available for the etching stopper in so far as it exhibits a large selectivity to the heavily doped p-type GaAs without undesirable influence on the properties required for the base region. It is desirable to reduce the etching stopper as thin as possible in so far as it can serve as the etching stopper.

As will be appreciated from the foregoing description, the channel region 3*c* is formed through the epitaxial growth and the etching. A thermal diffusion does not participate the formation of the channel region 3*c*. For this reason, the differential negative resistance element according to the present invention is free from the trade-off between the depth and the lateral length. The channel region 3*c* incorporated in the differential negative resistance element according to the present invention is precisely adjusted to the designed features, and the transistor characteristics are surely improved. The etching is easily controlled rather than the thermal diffusion. For this reason, the differential negative resistance element is reproducible, and the production yield is enhanced.

Although particular embodiments of the present invention have been shown and described, it will be apparent to those skilled in the art that various changes and modifications may be made without departing from the spirit and scope of the present invention.

The base contact region 3*b* may be as thin as the channel region 3*c*. In this instance, only the emitter layer 4 is covered with the photo-resist etching mask. A cap layer may be inserted between the base contact region 3*b* and the base electrode 6.

In the second embodiment, the gate insulating layer 8 is formed through the thermal oxidation. Nitride may be thermally grown in nitrogen atmosphere for forming a gate insulating layer of nitride. Otherwise, a plasma refining may be carried out in oxygen plasma or nitrogen plasma. If the gate insulating layer 8 and the gate electrode 9 are formed on the channel region of compound semiconductor, insulating material may be deposited on the channel region 3*c*.

The compound semiconductor materials in the GaAs/AlGaAs system and the semiconductor materials in the Si/SiGe system are employed in the first, third and fourth embodiments and the second embodiment. However, other semiconductor systems are available for the differential negative resistance element according to the present invention. SiC, GaN, InP, InGaAs, GaSb and InAs are examples of the semiconductor materials available for the differential negative resistance element.

Although the above-described embodiments are categorized in the n-p-n type bipolar transistor, the present invention is applicable to the p-n-p type bipolar transistor.

The molecular beam epitaxy is used in the process according to the present invention. However, the epitaxial growing technique is never limited to the molecular beam epitaxy. Any epitaxial growing technique is available. A metalorganic chemical vapor deposition (MOCVD) is an example of the epitaxial growing technique available for the laminated semiconductor structure.

A cap layer may be further incorporated in the differential negative resistance element according to the present invention.

What is claimed is:

1. A differential negative resistance element comprising:
a multi-layered semiconductor structure formed on a substrate, and including a first semiconductor layer having a first conductivity type and serving as one of a collector region and an emitter region of a bipolar transistor, a second semiconductor layer having a second conductivity type opposite to said first conductivity type and serving as a base contact region, a base region having a first thickness and a channel region with second thickness less than said first thickness located between said base contact region and said base region and a third semiconductor layer having said first conductivity type and serving as the other of said collector region and said emitter region; and
collector, base and emitter electrodes serving as ohmic electrodes respectively connected to said collector, said base contact region and said emitter region, said channel region being thinner than said base contact region and said base region, the thickness of said channel region being reduced to a degree such that the device's resistance varies as a collector voltage applied to said collector electrode varies.

2. The differential negative resistance element as set forth in claim 1, in which said channel region has a thickness and a dopant concentration, and the product between said thickness and said dopant concentration ranges from $1\times10^{11}$ cm$^{-2}$ to $1\times10^{13}$ cm$^{-2}$.

3. The differential negative resistance element as set forth in claim 1, in which said first semiconductor layer and said third semiconductor layer serve as said collector region and said emitter region, respectively, and said collector electrode, said base electrode and said emitter electrode are held in contact with a lower surface of said substrate formed of a semiconductor, an upper surface of a base contact region formed in said second semiconductor layer and located on the opposite side of said base region with respect to said channel region and an upper surface of said emitter region, respectively.

4. The differential negative resistance element as set forth in claim 1, in which said first semiconductor layer and said third semiconductor layer serve as said emitter region and said collector region, respectively, and said emitter electrode, said base electrode and said collector electrode are held in contact with a lower surface of said substrate formed of a semiconductor, an upper surface of said base contact region and an upper surface of said collector region, respectively.

5. The differential negative resistance element as set forth in claim 1, in which said first semiconductor layer and said second semiconductor layer are formed of gallium arsenide, and said third semiconductor layer is formed of aluminum gallium arsenide.

6. The differential negative resistance element as set forth in claim 1, in which said first semiconductor layer and said third semiconductor layer are formed of silicon, and said second semiconductor layer is formed of silicon germanium.

7. The differential negative resistance element as set forth in claim 1, further comprising a gate insulating layer formed on said channel region and a gate electrode formed on said gate insulating layer and connected to said collector electrode.

8. The differential negative resistance element as set forth in claim 1, in which said multi-layered semiconductor structure further includes a fourth semiconductor layer having said second conductivity type and formed on said first semiconductor layer for forming a p-n function therebetween, and said collector electrode is held in contact with said fourth semiconductor layer.

9. The differential negative resistance element as set forth in claim 1, in which said multi-layered semiconductor structure further includes a fourth semiconductor layer having said second conductivity type and formed in said second semiconductor layer in such a manner as to split said second semiconductor layer into a lower sub-layer formed on said first semiconductor layer and upper sub-layers spaced from each other by a gap thereon, and said fourth semiconductor layer is different in etching speed from said second semiconductor layer.

10. The differential negative resistance element as set forth in claim 9, in which said first semiconductor layer, said second semiconductor layer, said third semiconductor layer and said fourth semiconductor layer are formed of gallium arsenide, gallium arsenide, aluminum gallium arsenide and aluminum arsenide.

11. A process for fabricating a differential negative resistance element, comprising the steps of:
a) successively growing a first semiconductor layer having a first conductivity type and serving as one of a collector region and an emitter region of a bipolar transistor, a second semiconductor layer having a second conductivity type opposite to said first conductivity type and serving as a base contact region, a base region and a channel region located between said base contact region and said base region and a third semiconductor layer having said first conductivity type and serving as the other of said collector region and said emitter region on a substrate;
b) partially etching said third semiconductor layer so as to expose a portion of said second semiconductor layer;
c) partially etching said portion of said second semiconductor layer so as to form said channel region between said base contact region and said base region so that a collector voltage applied to said collector region varies an electric resistance in said channel region; and
d) forming a collector electrode, a base electrode and an emitter electrode held in contact with said collector region, said base contact region and said emitter region in an ohmic manner.

12. The process as set forth in claim 11, in which an epitaxial growing technique is used in said step a).

13. The process set forth in claim 12, in which said epitaxial growing technique is a molecular beam epitaxy.

14. The process set forth in claim 12, in which said epitaxial growing technique is a metalorganic chemical vapor deposition.

15. The process as set forth in claim 11, further comprising the step of e) forming an insulating layer on said channel region between said step c) and said step d), and f) forming a gate electrode connected to said collector electrode on said insulating layer between said step e) and said step d).

16. The process as set forth in claim 15, in which said insulating layer is thermally grown in an oxidizing atmosphere.

17. The process as set forth in claim 11, in which a collector contact region is further formed through said etching in said step c) so that said collector electrode is connected to said collector region through said collector contact region.

18. The process as set forth in claim 11, in which said second semiconductor layer is intermittently grown so as to permit a fourth semiconductor layer to be grown between a lower sub-layer of said second semiconductor layer and an upper sub-layer of said second semiconductor layer in said step a), and said fourth semiconductor layer is lower in etching speed than said second semiconductor layer so that said fourth semiconductor layer serves as an etching stopper in said step c).

* * * * *